(12) United States Patent
Kang et al.

(10) Patent No.: US 8,315,089 B2
(45) Date of Patent: Nov. 20, 2012

(54) PHASE CHANGE MEMORY DEVICE WITH IMPROVED PERFORMANCE THAT MINIMIZES CELL DEGRADATION

(75) Inventors: Hee Bok Kang, Cheongju-si (KR); Suk Kyoung Hong, Gwacheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/166,241

(22) Filed: Jun. 22, 2011

(65) Prior Publication Data

US 2011/0255333 A1 Oct. 20, 2011

Related U.S. Application Data

(62) Division of application No. 12/147,754, filed on Jun. 27, 2008, now abandoned.

(30) Foreign Application Priority Data

Oct. 16, 2007 (KR) .................... 10-2007-0104129

(51) Int. Cl.
*G11C 11/21* (2006.01)
(52) U.S. Cl. ...................................... 365/163; 365/148
(58) Field of Classification Search ................ None
See application file for complete search history.

(56) References Cited

U.S. PATENT DOCUMENTS

| | | | |
|---|---|---|---|
| 6,597,598 B1 * | 7/2003 | Tran et al. ...................... 365/94 |
| 7,382,656 B2 * | 6/2008 | Ho et al. .................. 365/185.22 |
| 2006/0067144 A1 * | 3/2006 | Liu .............................. 365/203 |
| 2007/0206403 A1 * | 9/2007 | Shirahama et al. ........... 365/148 |
| 2008/0159017 A1 * | 7/2008 | Kim et al. ................ 365/189.09 |

* cited by examiner

*Primary Examiner* — Hoai V Ho
*Assistant Examiner* — James G Norman
(74) *Attorney, Agent, or Firm* — William Park & Associates Ltd.

(57) ABSTRACT

A phase change memory device having an improved performance that minimizes cell degradation is presented. The phase change memory device includes: a cell array, a sense amplifier, a write driving unit, and a reference level selecting unit. The cell array has a phase change resistor is configured to read/write data. The sense amplifier is configured to compare a reference voltage with a sensing voltage received from the cell array. The write driving unit is configured to supply a driving voltage corresponding to write data to the cell array. The reference level selecting unit is configured to select a read reference voltage in a read mode so as to output the reference voltage, and to select a reference voltage corresponding to input data in a write verifying mode so as to output the reference voltage.

20 Claims, 21 Drawing Sheets

PHASE CHANGE MEMORY DEVICE WITH IMPROVED PERFORMANCE THAT MINIMIZES CELL DEGRADATION

CROSS-REFERENCE TO RELATED APPLICATION

This application is based upon and claims the benefit of priority to Korean Patent Application No. 10-2007-0104129, filed on Oct. 16, 2007, the entire contents of which are incorporated herein by reference.

BACKGROUND OF THE INVENTION

The present invention relates generally to a phase change memory device, and more particularly, to a memory device that has a phase change resistor which exhibits improved sensing performance and reliability due to resistance to memory cell degradation processes.

Some well known nonvolatile memory storage devices include magnetic memory and phase change memory (PCM) devices. The PCM devices can exhibit data processing speeds similar to that of a volatile Random Access Memory (RAM) device. Further PCM devices enjoy the advantage of being able to conserve or maintain data even after the power is turned off.

FIGS. 1a and 1b are diagrams illustrating a conventional phase change resistor (PCR) 4.

The conventional PCR 4 comprises a phase change material (PCM) 2 inserted between a top electrode 1 and a bottom electrode 3. When a voltage and a current are imposed across the top and bottom electrodes (1,3) the temperature is raised in the PCM 2 which can result in altering the electric conductive properties and thereby the resistance changes as a function of the resultant solid state morphology.

PCM 2 devices can include the chalcogenide AgLnSbTe. The PCM 2 often times includes a chalcogenide having at least one of the chalcogen elements (S, Se, Te) as a main ingredient, and containing other ingredients such as germanium and antimony. One PCM 2 of to interest is the germanium antimonic tellurium consisting of Ge—Sb—Te (Ge2Sb2Te5).

FIGS. 2a and 2b are diagrams illustrating a principle of the conventional PCR 4.

As shown in FIG. 2a, the PCM 2 can change its solid state crystalline structure, i.e., can become crystallized, when a low current of less than a threshold value flows in the PCM 4. As a result, of the highly order crystalline lattice morphology of the PCM 2, this crystallized form of the PCM 2 exhibits a relatively low resistance.

As shown in FIG. 2b, the crystalline morphological state of the PCM 2 can be induced to melt when a current of more than a threshold value is imposed across the PCR 4. As a result of raising the temperature above the crystalline melting temperature coupled by a relatively rapid cooling period of the melted PCM 2, the solid state morphology of the PCM 2 can be transformed into an alternate chaotic ordered solid state of being an amorphous morphology. It is though that because of the increased number or increased density of crystal imperfections in this amorphous state, the amorphous PCM 2 exhibits a relatively higher electrical resistance, as compared to the PCM 2 in a crystalline state.

Accordingly, one can exploit this difference in physical properties by designing a PCR 4 to be configured to store nonvolatile data corresponding to the two resistance states. One could arbitrarily assign a data "1" state to refer to when the PCR 4 exhibits a relatively low resistance state. Likewise, one could arbitrarily assign a data "0" state to refer to when the PCR 4 exhibits a relatively high resistance state. Accordingly, binary logic states can be stored in these types of PCM devises without the need for perpetually powering these devices.

FIG. 3 is a diagram illustrating a write operation of a conventional phase change resistant cell.

When heat is generated from an electrical current flowing across the top electrode 1 and the bottom electrode 3 of the PCR 4, the solid state morphology of the PCM 2 can be transformed back and forth from a crystalline to an amorphous solid state when the heat is raised above the melting point.

In contrast, when heat is generated from an low amount of electrical current flowing across the top electrode 1 and the bottom electrode 3 of the PCR 4, the solid state morphology of the PCM 2 in the crystalline morphological state can be maintained, regardless of being the crystalline or amorphous solid states. In contrast, when heat is generated from a slightly higher amount of electrical current flowing across the top electrode 1 and the bottom electrode 3 of the PCR 4, the solid state morphology of the PCM 2 in the crystalline state can be altered. As long as the melted PCM can be gently or slowly annealed the PCM can be either maintained or transformed into the crystalline morphological solid state. As a result of imposing this low temperature heating condition, the resultant PCR 4 exhibits a low resistor which can be arbitrarily defined to be a set state. On the other hand, when a relatively higher electrical current flows across the top electrode 1 and the bottom electrode 3 of the PCR 4, the PCM be transformed into an amorphous morphological solid state from the heating and from the relatively rapid cooling. As a consequence when the PCR 4 in the amorphous state it exhibits a relatively higher resistance which can be arbitrarily defined as a reset state. A physical property difference between these two morphological solid state phases is thought to be the responsible cause for the changes in the electric resistance.

A low voltage is applied to the PCR 4 for a long time in order to allow the PCM 2 to transform into the crystalline state and thus write the set state in a write mode. On the other hand, a high voltage is applied to the PCR 4 for a short time in order to allow the melted PCM 2 to rapidly cool into the amorphous state and thus write the reset state in the write mode.

However, the conventional phase change memory device distinguishes data with the same reference voltage in a read mode and in a write verifying mode. As a result, the stability of write data operation can be degraded in the write verifying mode due to cell degradation. In the read mode, a margin of a sensing voltage is reduced.

SUMMARY OF THE INVENTION

Various embodiments are directed towards providing a memory device having a phase change resistor configured to set a different reference voltage level in a read mode and in a write verifying mode in order to increase the stability of write data in the write verifying mode, thereby improving reliability by minimizing cell degradation.

Various embodiments are directed at providing a memory device having a phase change resistor configured to set a different reference voltage level in a read mode and in a write verifying mode to increase a sensing voltage margin in the read mode, thereby improving sensing performance.

According to an embodiment of the present invention, a phase change memory device comprises: a cell array including a phase change resistor configured to read/write data; a sense amplifier configured to compare a reference voltage with a sensing voltage received from the cell array; a write driving unit configured to supply a driving voltage corresponding to write data to the cell array; and a reference level selecting unit configured to select a read reference voltage in a read mode so as to output the reference voltage, and to select a reference voltage corresponding to input data in a write verifying mode so as to output the reference voltage.

According to an embodiment of the present invention, a phase change memory device comprises: a cell array including a phase change resistor configured to read/write data; a plurality of sense amplifiers configured to compare a reference voltage having a multi-level with a sensing voltage having a multi-level received from the cell array; a plurality of write driving units configured to supply a driving voltage having a multi-level corresponding to write data to the cell array; and a reference level selecting unit configured to select a read reference voltage having a multi-level in a read mode so as to output the reference voltage and to select a reference voltage having a multi-level corresponding to input data in a write verifying mode so as to output the reference voltage.

DETAILED DESCRIPTION

Figure 1A:
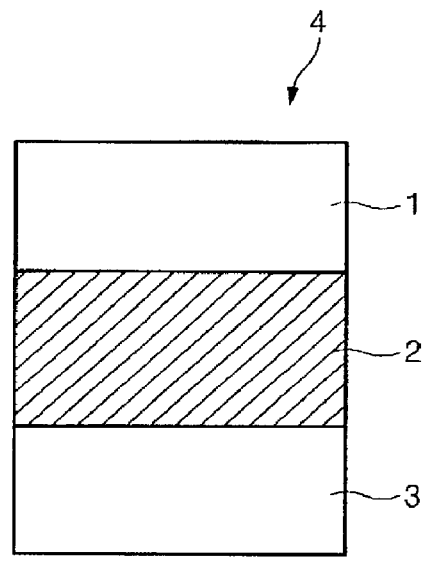
FIGS. 1a and 1b are diagrams illustrating a conventional phase change resistor.
Figure 1B:
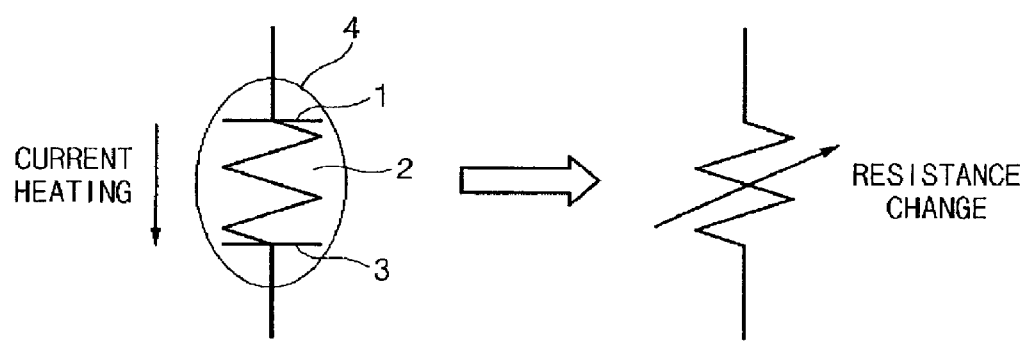
Figure 2A:
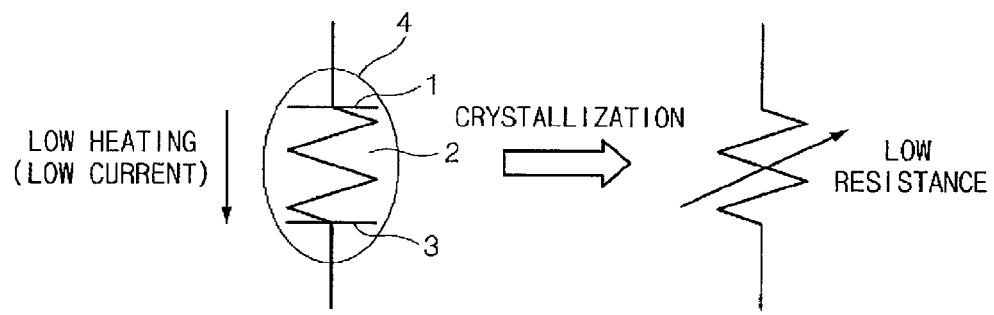
FIGS. 2a and 2b are diagrams illustrating a principle of the conventional phase change resistor.
Figure 2B:
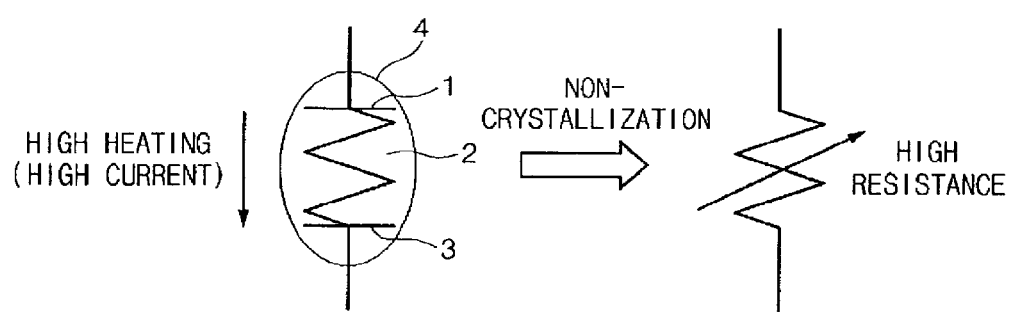
Figure 3:
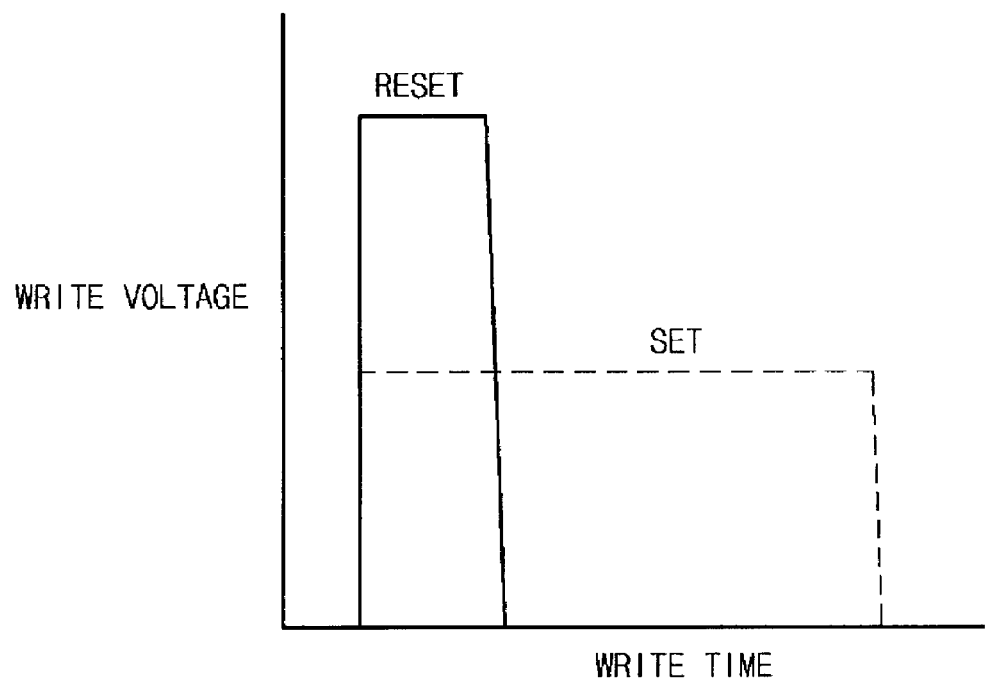
FIG. 3 is a diagram illustrating a write operation of a conventional phase change resistant cell.
Figure 4:
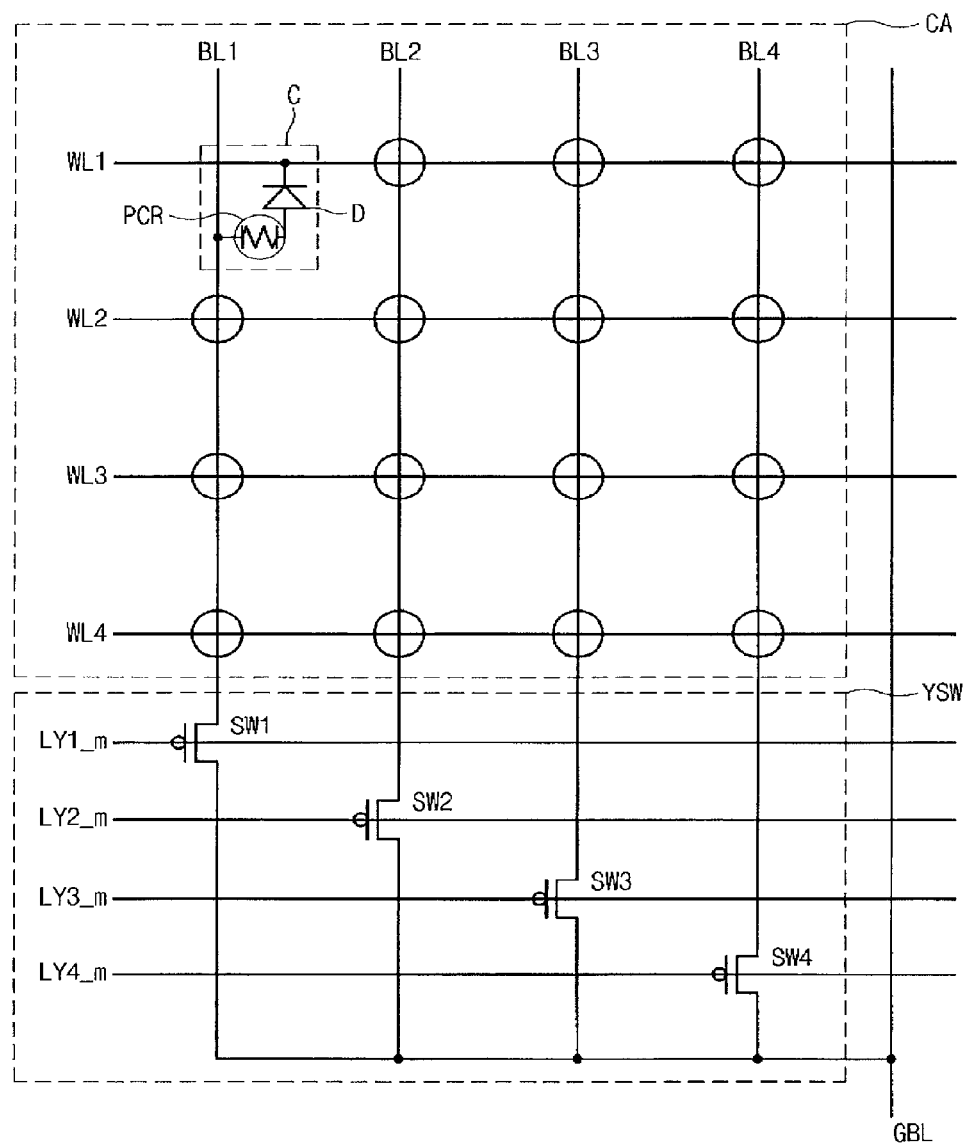
FIG. 4 is a circuit diagram illustrating a cell array and a column switching unit of a phase change memory device according to an embodiment of the present invention.

FIG. 4 is a circuit diagram illustrating a cell array and a column switching unit of a phase change memory device according to an embodiment of the present invention.

The phase change memory device of FIG. 4 comprises a cell array CA and a column switching unit YSW coupled to the cell array CA. The column switching unit YSW includes PMOS transistors SW1~SW4. Although the column switching unit YSW is shown to include PMOS transistors in this exemplary embodiment, the present invention is understood to be not limited herein but may include any number of different electronic configures that can even include NMOS transistors.

The cell array CA includes a plurality of unit cells C positioned at intersections of bit lines BL and word lines WL. The unit cell C includes a phase change resistor PCR and a diode D. The diode D includes a PN diode element.

The phase change resistor PCR has one electrode connected to the bit line BL and the other electrode connected to a P-type region of the diode D. An N-type region of the diode D is connected to the word line WL.

A low voltage is applied to the selected word line WL in a read mode. A read voltage Vread is applied to the bit line BL, so that a read current Iset having a set state or a read current Ireset having a reset state flows towards the word line WL through the bit line BL, the phase change resistor PCR and the diode D.

The PMOS transistors SW1~SW4 are connected between the bit line BL and a global bit line GBL and have gates configured to receive column selecting signals LY1_m~LY4_m. The phase change memory device has a hierarchical bit line structure including the bit lines BL connected to one global bit line GBL.

The PMOS transistors SW1~SW4 are selectively turned on in response to the column selecting signals LY1_m~LY4_m so as to control connection of the bit line BL and the global bit line GBL. In an active mode, one of the column selecting signals LY1_m~LY4_m is activated to select the unit cell C connected to the corresponding bit line BL.

Figure 5:
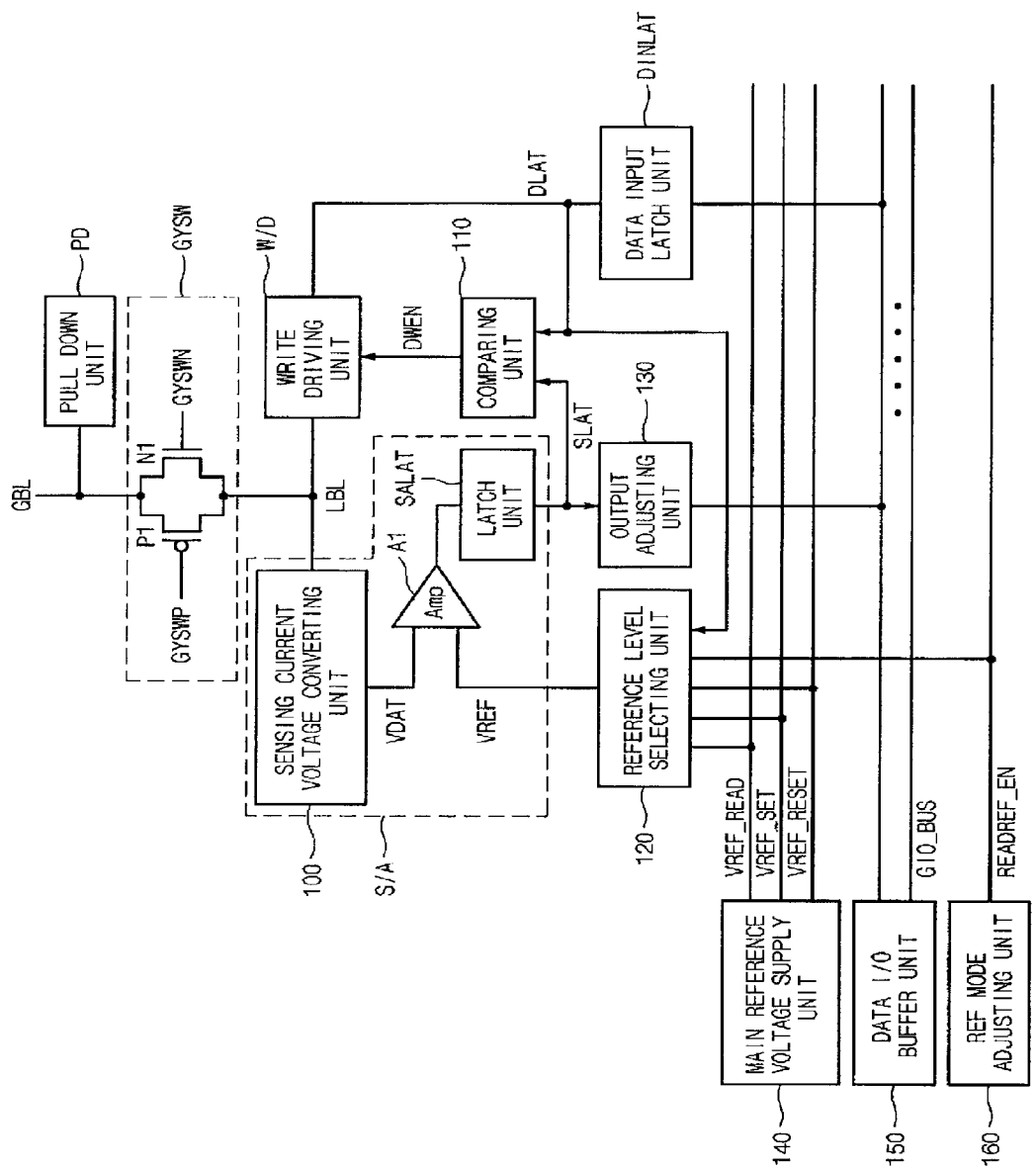
FIG. 5 is a circuit diagram illustrating a reference voltage supply unit of a phase change memory device according to an embodiment of the present invention.

FIG. 5 is a circuit diagram illustrating one embodiment of a reference voltage supply unit of a phase change memory device according to an embodiment of the present invention.

One embodiment of the phase change memory device comprises a pull-down unit PD, a global column switching unit GYSW, a sense amplifier S/A, a write driving unit W/D, a comparing unit 110, a reference level selecting unit 120, an output adjusting unit 130, a data input latch unit DINLAT, a main reference voltage supply unit 140, a data input/output buffer unit 150 and a reference mode adjusting unit 160.

One embodiment of the sense amplifier S/A includes a sensing current voltage converting unit 100, an amplifier A1 and a latch unit SALAT. The sense amplifier S/A senses cell data received from the global bit line GBL, and compares the cell data with a reference voltage VREF to distinguish signals associated with the binary logic data "0" from the binary logic data "1". The write driving unit W/D supplies a driving voltage corresponding to write data to the global bit line GBL when data is written in the cell.

The pull-down unit PD precharges the global bit line GBL to a low voltage in a precharge mode.

The global column switching unit GYSW includes a PMOS transistor P1 and a NMOS transistor N1. The PMOS transistor P1 is connected between the global bit line GBL and a node LBL. The PMOS transistor P1 has a gate configured to receive a global column switching signal GYSWP. The NMOS transistor N1 is connected between the global bit line GBL and the node LBL. The NMOS transistor N1 has a gate configured to receive a global column switching signal GYSWN.

The global column switching signal GYSWP has a different phase from that of the global column switching signal GYSWN. The node LBL is a terminal for supplying an output signal of the global bit line GBL to the sense amplifier S/A and for transmitting a driving voltage of the write driving unit W/D to the global bit line GBL.

The sensing current voltage converting unit 100 converts a cell sensing current received from the node LBL to convert the current into a voltage, thereby outputting a sensing voltage VDAT. The amplifier A1 compares and amplifies the reference voltage VREF with the sensing voltage VDAT. The latch unit SALAT latches an output signal of the amplifier A1 to output the output signal to the latch data SLAT.

In order to verify data in a read mode, the comparing unit 110 compares the latch data SLAT of the sense amplifier S/A with input data DLAT received from the data input latch unit DINLAT to output a driving enable signal DWEN.

The comparing unit 110 activates the driving enable signal DWEN when the latch data SLAT is found to be different from the input data DLAT. The comparing unit 110 inactivates the driving enable signal DWEN when the latch data SLAT is found to be identical with the input data DLAT.

The write driving unit W/D outputs the input data DLAT to the node LBL in response to the driving enable signal DWEN. That is, the write driving unit W/D outputs the input data DLAT to the node LBL in activation of the driving enable signal DWEN. On the other hand, the operation of the write driving unit W/D is stopped in inactivation of the driving enable signal DWEN not to output the input data DLAT to the node LBL.

The reference level selecting unit 120 selects a corresponding reference voltage level selected from a read reference voltage VREF_READ, a set reference voltage VREF_SET and a reset reference voltage VREF_RESET in response to a reference enable signal READREF_EN and the input data DLAT to output the reference voltage VREF.

The reference level selecting unit 120 is additionally configured to set the reference voltage in a read mode and a write verifying mode. That is, in the read mode of a single bit storage cell, the read reference voltage VREF_READ is selected. On the other hand, in the write verifying mode, the set reference voltage VREF_SET or the reset reference voltage VREF_RESET is selected.

The output adjusting unit 130 outputs the latch data SLAT to the data input/output buffer unit 150 through a global input/output line GIO_BUS. The data input latch unit DINLAT latches input data received from the data input/output buffer unit 150 through the input/output line GIO_BUS to output the input data DLAT.

The main reference voltage supply unit 140 generates the read reference voltage VREF_READ used in the read mode, the set reference voltage VREF_SET and the reset reference voltage VREF_RESET used in the write verifying mode.

The data input/output buffer unit 150 buffers an output signal of the output adjusting unit 130 to output the output signal to the global input/output line GIO_BUS, and buffers an output signal of the global input/output line GIO_BUS to output the output signal to the data input latch unit DINLAT.

The reference mode adjusting unit 160 outputs the reference enable signal READREF_EN for selecting the corresponding reference voltage in the write verifying mode.

Figure 6:
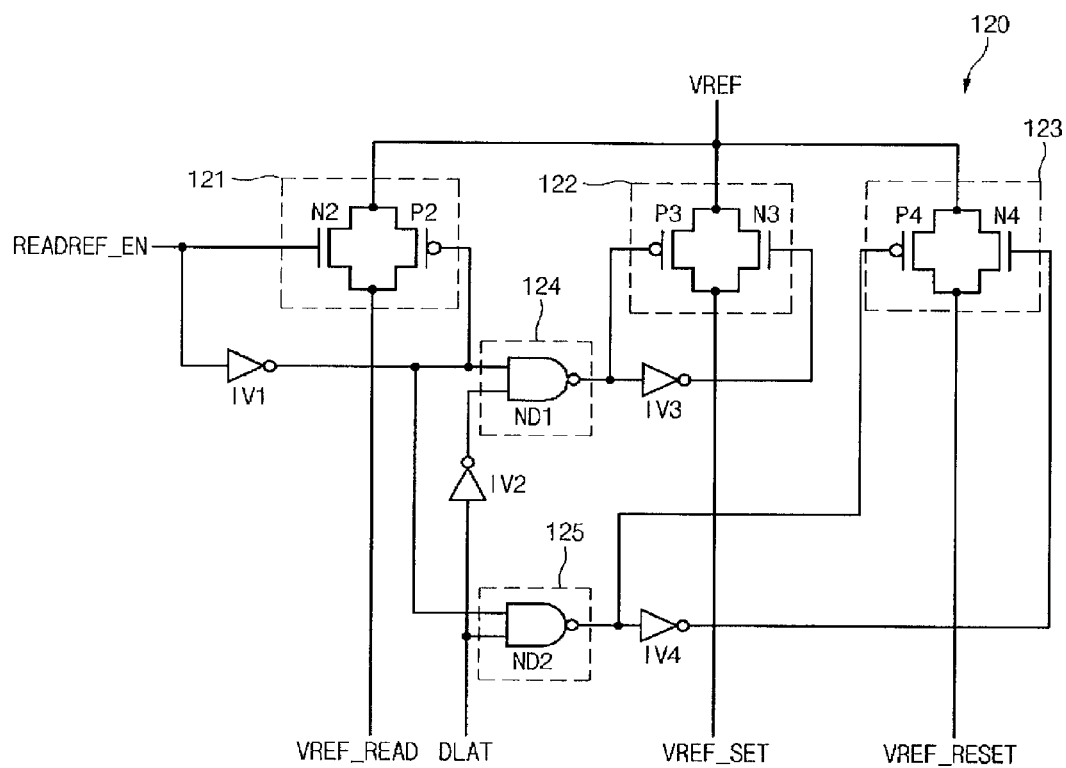
FIG. 6 is a circuit diagram illustrating a reference level selecting unit of FIG. 5.

FIG. 6 is one exemplary embodiment of a circuit diagram illustrating the reference level selecting unit 120 of FIG. 5.

One embodiment of the reference level selecting unit 120 can include a read reference switch 121, a set reference switch 122, a reset reference switch 123, a set reference enable unit 124, a reset reference enable unit 125 and a plurality of inverters IV1~IV4.

The read reference switch 121 can include a NMOS transistor N2 and a PMOS transistor P2 which are connected in parallel between a reference voltage VREF receiving terminal and a read reference voltage VREF_READ receiving terminal. The NMOS transistor N2 has a gate configured to receive the reference enable signal READREF_EN. The PMOS transistor P2 has a gate configured to receive the reference enable signal READREF_EN inverted by the inverter IV1.

The set reference enable unit 124 includes a NAND gate ND1. The NAND gate ND1 performs an NAND operation on the reference enable signal READREF_EN inverted by the inverter IV1 and the input data DLAT inverted by the inverter IV2.

The reset reference enable unit 125 includes a NAND gate ND2. The NAND gate ND2 performs the reference enable signal READREF_EN inverted by the inverter IV1 and the input data DLAT.

The set reference switch 122 includes a NMOS transistor N3 and a PMOS transistor P3 which are connected in parallel between the reference voltage VREF receiving terminal and a set reference voltage VREF_SET receiving terminal. The NMOS transistor N3 has a gate configured to receive an output signal of the set reference enable unit 124 inverted by the inverter IV3. The PMOS transistor P3 has a gate configured to receive the output signal of the set reference enable unit 124.

The reset reference switch 123 includes a NMOS transistor N4 and a PMOS transistor P4 which are connected in parallel between the reference voltage VREF receiving terminal and a reset reference voltage VREF_RESET receiving terminal. The NMOS transistor N4 has a gate configured to receive an output signal of the reset reference enable unit 125 inverted by the inverter IV4. The PMOS transistor P4 has a gate configured to receive the output signal of the reset reference enable unit 125.

Hereinafter, the operation of the reference level selecting unit 120 is described.

In case of the single bit storage cell, the reference enable signal READREF_EN is activated to a high level in order to select the read reference voltage VREF_READ used in the read mode. As a result, the read reference switch 121 is turned on, so that the reference voltage VREF is at a read reference voltage VREF_READ level.

When the reference enable signal READREF_EN is activated, input signals of the NAND gates ND1 and ND2 are at a low level, so that the set reference switch 122 and the reset reference switch 123 are kept turned-off.

On the other hand, the set reference voltage VREF_SET and the reset reference voltage VREF_RESET used in the write verifying mode are selectively outputted depending on a level of the input data DLAT.

When the reference enable signal READREF_EN is inactivated to a low level, the read reference switch 121 is turned off. As a result, the set reference switch 122 and the reset reference switch 123 are in a condition to be activated.

When the input data DLAT is set data, that is, at a low level, an output signal of the NAND gate ND1 is at a low level. As a result, the set reference switch 122 is turned on so that the reference voltage VREF has a set reference voltage VREF_SET level.

When the input data DLAT is reset data, that is, set at a high level, an output signal of the NAND gate ND2 is set at a low level. As a result, the reset reference switch 123 is turned on so that the reference voltage VREF has a reset reference voltage VREF_RESET level.

Figure 7:
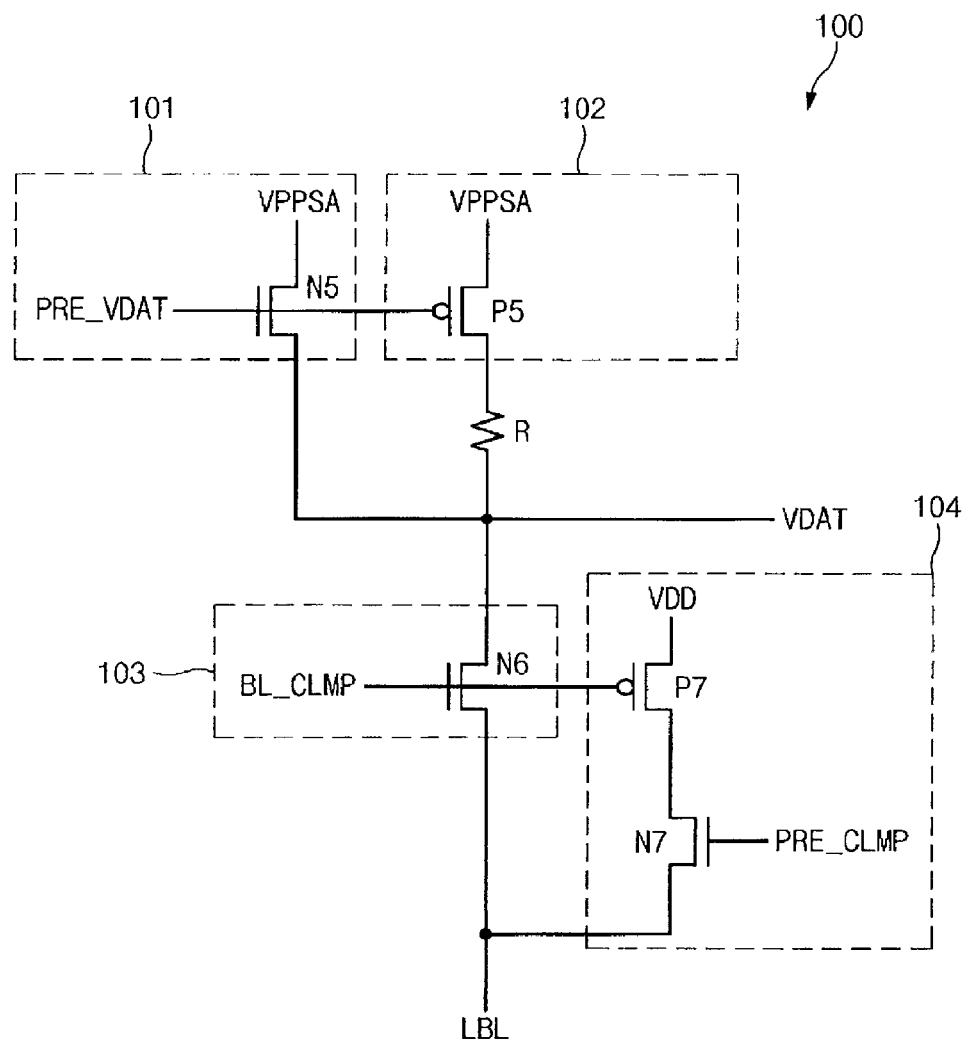
FIG. 7 is a circuit diagram illustrating a sensing current voltage converting unit of FIG. 5.

FIG. 7 is a circuit diagram illustrating one exemplary embodiment of the sensing current voltage converting unit 100 of FIG. 5.

The sensing current voltage converting unit 100 can include a precharge unit 101, an activating adjusting unit 102, a clamp voltage adjusting unit 103, a current sensing unit and a clamp voltage precharge unit 104. The current sensing unit includes a current sensing resistor R.

The precharge unit 101 includes a NMOS transistor N5. The NMOS transistor N5 is connected between a high voltage VPPSA receiving terminal and a sensing voltage VDAT output terminal. The NMOS transistor N5 has a gate configured to receive a precharge signal PRE_VDAT.

The activating adjusting unit 102 includes a PMOS transistor P5. The PMOS transistor P5 is connected between the high voltage VPPSA receiving terminal and the current sensing resistor R. The PMOS transistor P5 has a gate configured to receive the precharge signal PRE_VDAT.

The clamp voltage adjusting unit 103 includes a NMOS transistor N6. The NMOS transistor N6 is connected between the sensing voltage VDAT output terminal and the node LBL. The NMOS transistor N6 has a gate configured to receive a clamp signal BL_CLMP.

The clamp voltage precharge unit 104 includes a PMOS transistor P7 and a NMOS transistor N7. The PMOS transistor P7 is connected between a power voltage VDD receiving terminal and the NMOS transistor N7. The PMOS transistor P7 has a gate configured to receive the clamp signal BL_CLMP. The NMOS transistor N7 is connected between the PMOS transistor P7 and the node LBL. The NMOS transistor N7 has a gate configured to receive the precharge signal PRE_CLMP.

Hereinafter, the operation of the sensing current voltage converting unit 100 is described.

The precharge unit 101 precharges the sensing voltage VDAT to a high voltage VPPSA level before the sensing voltage VDAT is outputted in response to the precharge signal PRE_VDAT. The activating adjusting unit 102 raises the sensing voltage VDAT to a high voltage VPPSA level in response to the precharge signal PRE_VDAT.

The current sensing resistor R converts a sensing current of the cell received from the node LBL into the sensing voltage VDAT. The high voltage VPPSA is a power source for converting the sensing current into the sensing voltage VDAT with a pumping voltage VPP level.

In activation of the precharge signal PRE_VDAT, the NMOS transistor N5 is turned on to precharge the sensing voltage VDAT to a high voltage VPPSA level. In inactivation of the precharge signal PRE_VDAT, the PMOS transistor P5 is turned on to transit a voltage VDAT to the high voltage VPPSA level.

The clamp voltage adjusting unit 103 adjusts the node LBL to a clamp voltage level in response to the clamp signal BL_CLMP. The clamp voltage precharge unit 104 precharges the node LBL to a power voltage VDD level before the clamp signal BL_CLMP is activated. The clamp signal BL_CLMP is a signal for controlling the sensing voltage applied to the cell through the bit line BL.

When the clamp signal BL_CLMP is activated, the NMOS transistor N6 is turned on so that the node LBL is at the clamp voltage level. When the clamp signal BL_CLMP is inactivated and the precharge signal PRE_CLMP is activated, the PMOS transistor P7 and the NMOS transistor N7 are turned on to precharge the node LBL to the power voltage VDD level. The power voltage VDD is a power source supplied from the outside.

A clamp voltage depending on the clamp signal BL_CLMP has a voltage level higher than that of the power voltage VDD. The high voltage VPPSA has a voltage level higher than that of the clamp voltage depending on the clamp signal BL_CLMP.

Figure 8:
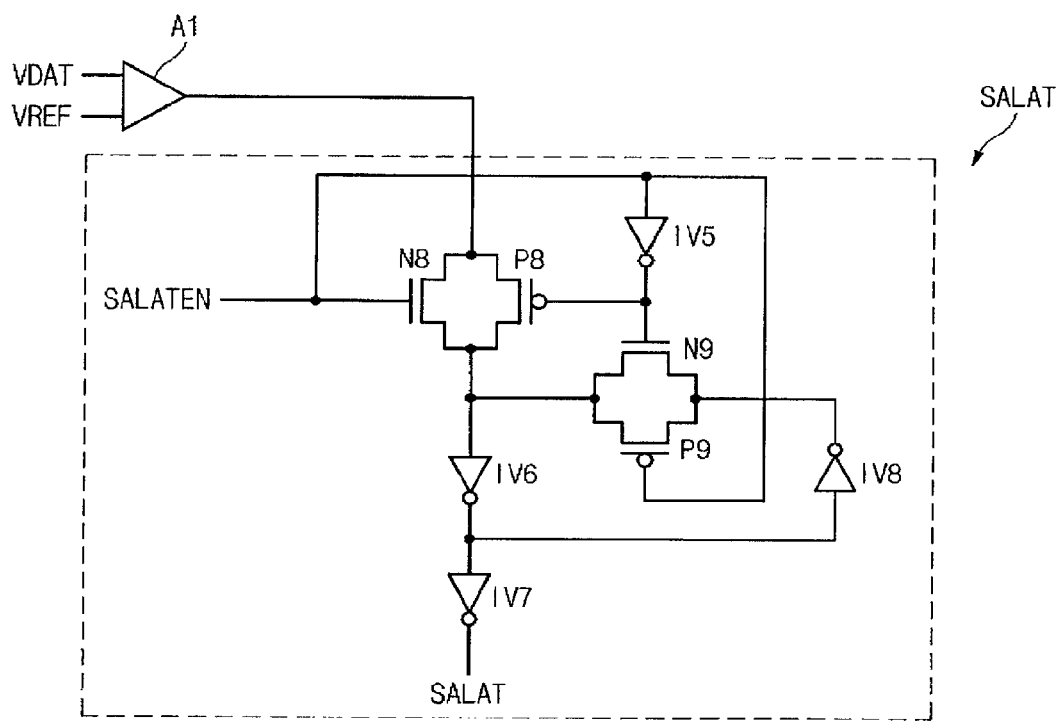
FIG. 8 is a circuit diagram illustrating a latch unit of FIG. 5.

FIG. 8 is a circuit diagram illustrating the latch unit SALAT of FIG. 5.

The latch unit SALAT can include NMOS transistors N8, N9, PMOS transistors P8, P9 and a plurality of inverters IV5~IV8.

The NMOS transistor N8 and the PMOS transistor P8 are connected between an input terminal of the inverter IV6 and an output terminal of the amplifier A1. The NMOS transistor N8 and the PMOS transistor P8 are selectively controlled by a latch enable signal SALATEN. The NMOS transistor N9 and the PMOS transistor P9 are connected between an input terminal of the inverter IV6 and an output terminal of the inverter IV8. The NMOS transistor N9 and the PMOS transistor P9 are selectively controlled by the latch enable signal SALATEN.

A first transmission gate including the NMOS transistor N8 and the PMOS transistor P8 is operated contrary to a second transmission gate including the NMOS transistor N9 and the PMOS transistor P9.

When the latch enable signal SALATEN is activated to a high level, the first transmission gate is turned on to transmit the output signal of the amplifier A1 to the inverter IV6. When the latch enable signal SALATEN is inactivated to a low level, the second transmission gate is turned on to latch an output signal of the first transmission gate.

Figure 9:
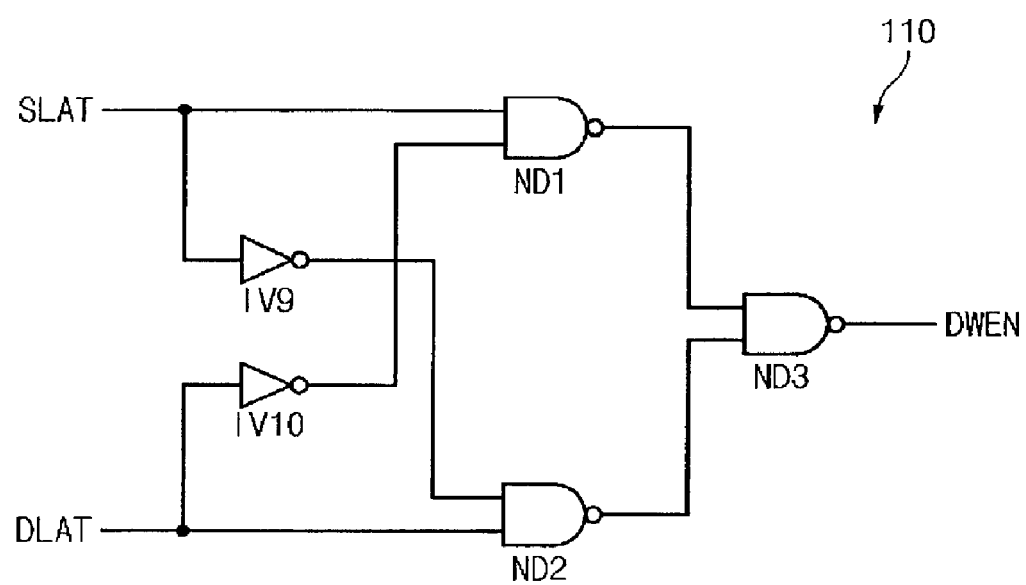
FIG. 9 is a circuit diagram illustrating a comparing unit of FIG. 5.

FIG. 9 is one exemplary embodiment of a circuit diagram illustrating the comparing unit 110 of FIG. 5.

The comparing unit 110 can include inverters IV9, IV10 and a plurality of NAND gates ND1~ND3, which are operated in accordance to an exclusive OR gate logic. When the latch data SLAT and the input data DLAT are inputted with the same level, the driving enable signal DWEN is outputted with a low level. When the latch data SLAT and the input data DLAT are inputted with a different level, the driving enable signal DWEN is outputted with a high level.

The NAND gate ND1 performs a NAND operation on the latch data SLAT and the input data DLAT is inverted by the inverter IV10. The NAND gate ND2 performs a NAND operation on the input data DLAT and the latch data SLAT is inverted by the inverter IV9. The NAND gate ND3 performs a NAND operation on output signals of the NAND gates ND1, ND2 to output the driving enable signal DWEN.

Figure 10:
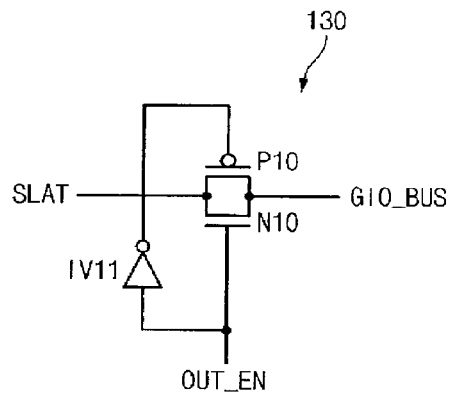
FIG. 10 is a circuit diagram illustrating an output adjusting unit of FIG. 5.

FIG. 10 is one exemplary embodiment of a circuit diagram illustrating the output adjusting unit 130 of FIG. 5.

The output adjusting unit 130 can include a PMOS transistor P10, a NMOS transistor N10 and an inverter IV11. The output adjusting unit 130 outputs the latch data SLAT to the global input/output line GIO_BUS in activation of the output enable signal OUT_EN.

Figure 11:
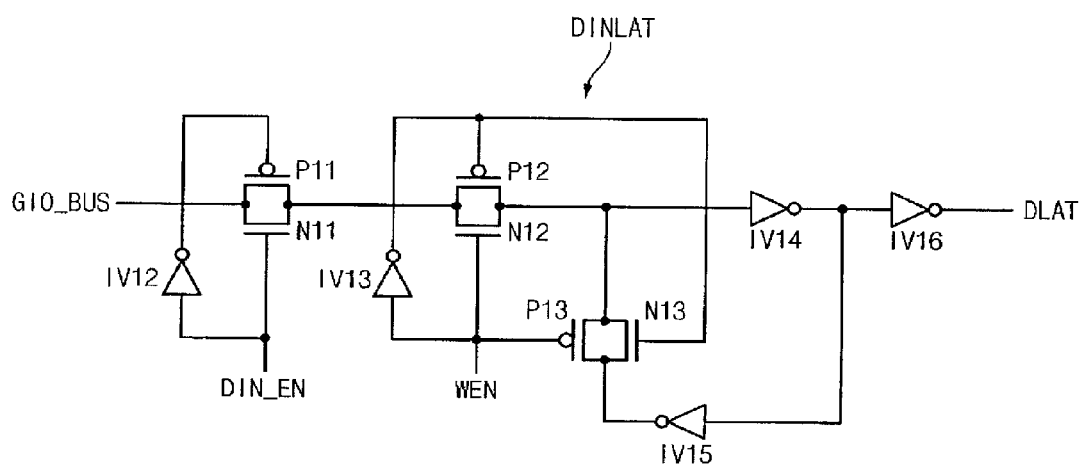
FIG. 11 is a circuit diagram illustrating a data input latch unit of FIG. 5.

FIG. 11 is one exemplary embodiment of a circuit diagram illustrating the data input latch unit DINLAT of FIG. 5.

The data input latch unit DINLAT can include PMOS transistors P11~P13, NMOS transistors N11~N13 and a plurality of inverters IV12~IV16.

A third transmission gate including the PMOS transistor P11 and the NMOS transistor N11 is controlled by a data input enable signal DIN_EN to selectively output a signal of the global input/output line GIO_BUS.

The NMOS transistor N12 and the PMOS transistor P12 are connected between the inverter IV14 and an output terminal of the third transmission gate. The NMOS transistor N12 and the PMOS transistor P12 are selectively controlled by a write enable signal WEN. The NMOS transistor N13 and the PMOS transistor P13 are connected between an input terminal of the inverter IV14 and an output terminal of the inverter IV16. The NMOS transistor N13 and the PMOS transistor P13 are selectively controlled by the write enable signal WEN.

A fourth transmission gate including the NMOS transistor N12 and the PMOS transistor P12 is operated contrary to a fifth transmission gate including the NMOS transistor N13 and the PMOS transistor P13.

When the write enable signal WEN is activated to a high level, the fourth transmission gate is turned on to output the signal of the global input/output line GIO_BUS to the inverter IV14. When the write enable signal WEN is inactivated to a low level, the fifth transmission gate is turned on to latch an output signal of the fourth transmission gate.

Figure 12:
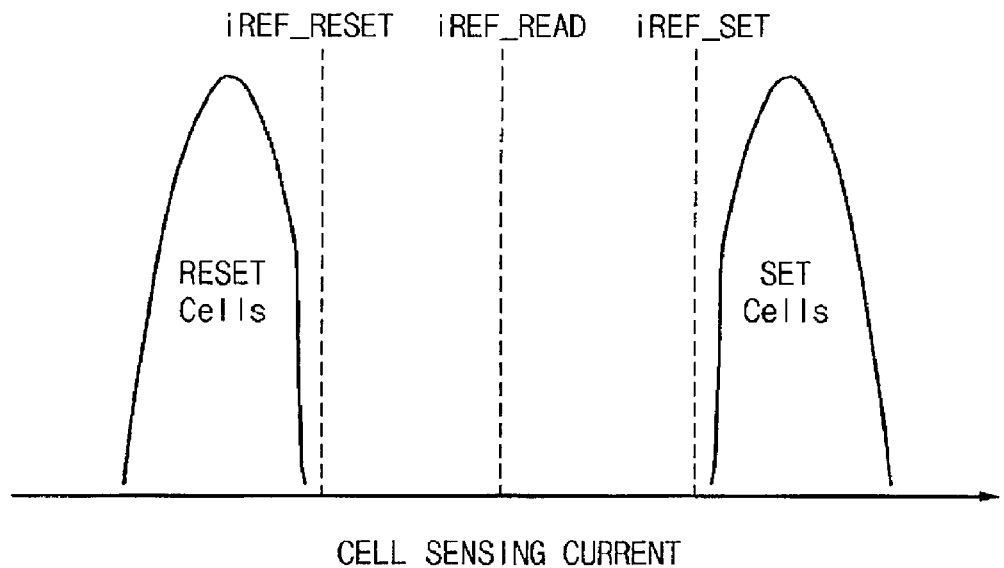
FIG. 12 is a diagram illustrating a relation of a cell sensing current and a reference current.

FIG. 12 is a diagram illustrating a relation of a cell sensing current and a reference current.

In the write verifying mode, a reference current of cells having a set state is represented as iREF_SET, and a reference current of cells having a reset state is represented as iREF_RESET. In the read mode, the reference current is represented as iREF_READ.

The reference current iREF_SET having a set state has a current value higher than that of the reference current iREF_READ in the read mode. The reference current iREF_RESET having a reset state has a current value lower than that of the reference current iREF_READ in the read mode.

That is, the reference currents iREF_SET, iREF_RESET of the write verifying mode are differentiated from the reference current iREF_READ of the read mode. Reset cells for storing a reset state have a cell sensing current value lower than that of the reference current iREF_RESET. Set cells for storing a set state have a cell sensing current value higher than that of the reference current iREF_SET.

Figure 13:
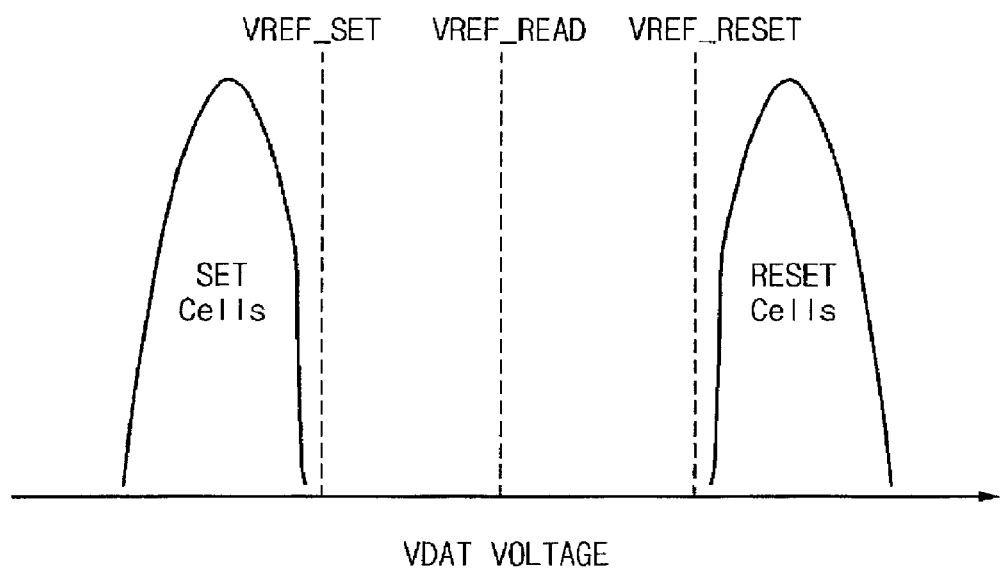
FIG. 13 is a diagram illustrating a relation of a cell sensing voltage and a reference voltage.

FIG. 13 is a diagram illustrating a relation of a cell sensing voltage and a reference voltage.

In the write verifying mode, a reference voltage of cells having a set state is represented as VREF_SET, and a reference voltage of cells having a reset state is represented as VREF_RESET. In the read mode, the reference voltage is represented as VREF_READ.

The reference voltage VREF_SET having a set state has a voltage value higher than that of the reference voltage VREF_READ in the read mode. The reference voltage VREF_RESET having a reset state has a voltage value lower than that of the reference voltage VREF_READ in the read mode.

That is, the reference voltages VREF_SET, VREF_RESET of the write verifying mode are differentiated from the reference voltage VREF_READ of the read mode. Reset cells for storing a reset state have a cell sensing voltage value lower than that of the reference voltage VREF_RESET. Set cells for storing a set state have a cell sensing voltage value higher than that of the reference voltage VREF_SET.

Figure 14:
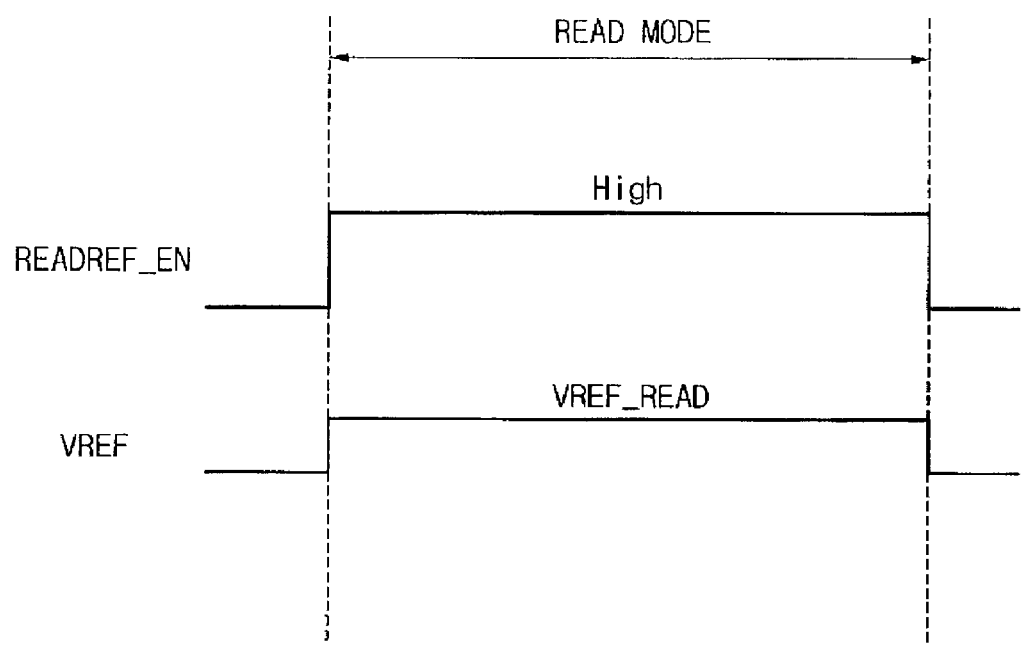
FIG. 14 is a diagram illustrating a read reference voltage level in a read mode.

FIG. 14 is a diagram illustrating a read reference voltage VREF_READ level in a read mode.

In the read mode, when the reference enable signal READREF_EN is activated to a high level, the read reference switch 121 is turned on. As a result, the reference voltage VREF outputted from the reference level selecting unit 120 has a read reference voltage VREF_READ level.

Figure 15:
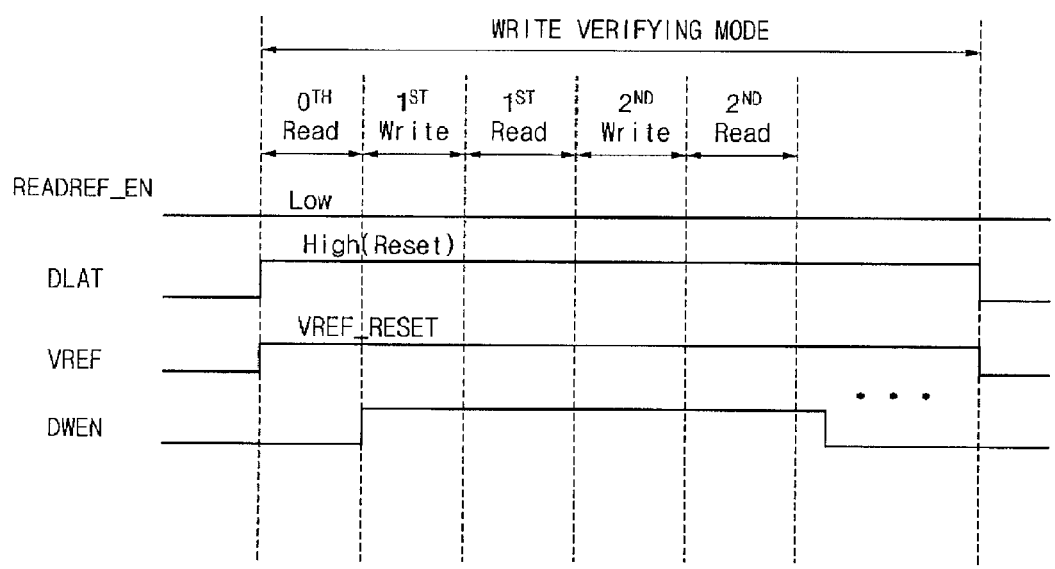
FIGS. 15 and 16 are diagrams illustrating reset/set reference voltage levels in a write verifying mode.

FIG. 15 is a diagram illustrating a reset reference voltage level in a write verifying mode.

In the write verifying mode, the reference enable signal READREF_EN is inactivated to a low level. When the input data DLAT has a high level, that is, reset data, the reference voltage VREF outputted from the reference level selecting unit 120 has a reset reference voltage VREF_RESET level. The driving enable signal DWEN is enabled to a high level in a first write verifying mode, so that the write driving unit W/D is activated.

Figure 16:
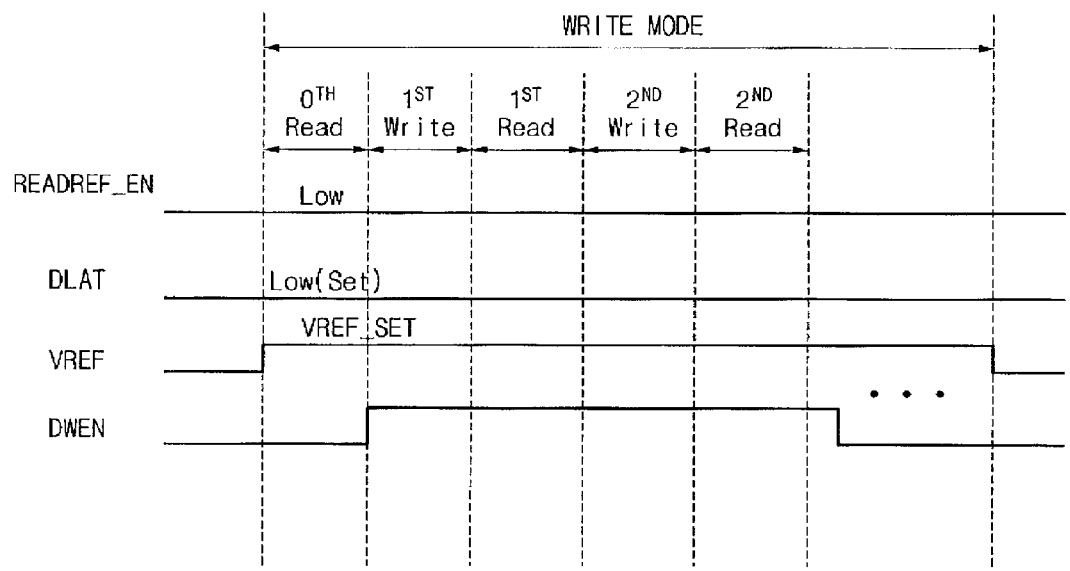

FIG. 16 is a diagram illustrating a set reference voltage level in a write verifying mode.

In the write verifying mode, the reference enable signal READREF_EN is inactivated to a low level. When the input data DLAT has a low level, that is, set data, the reference voltage VREF outputted from the reference level selecting unit 120 has a set reference voltage VREF_SET level. The driving enable signal DWEN is enabled to a high level in a first write verifying mode, so that the write driving unit W/D is activated.

Figure 17:
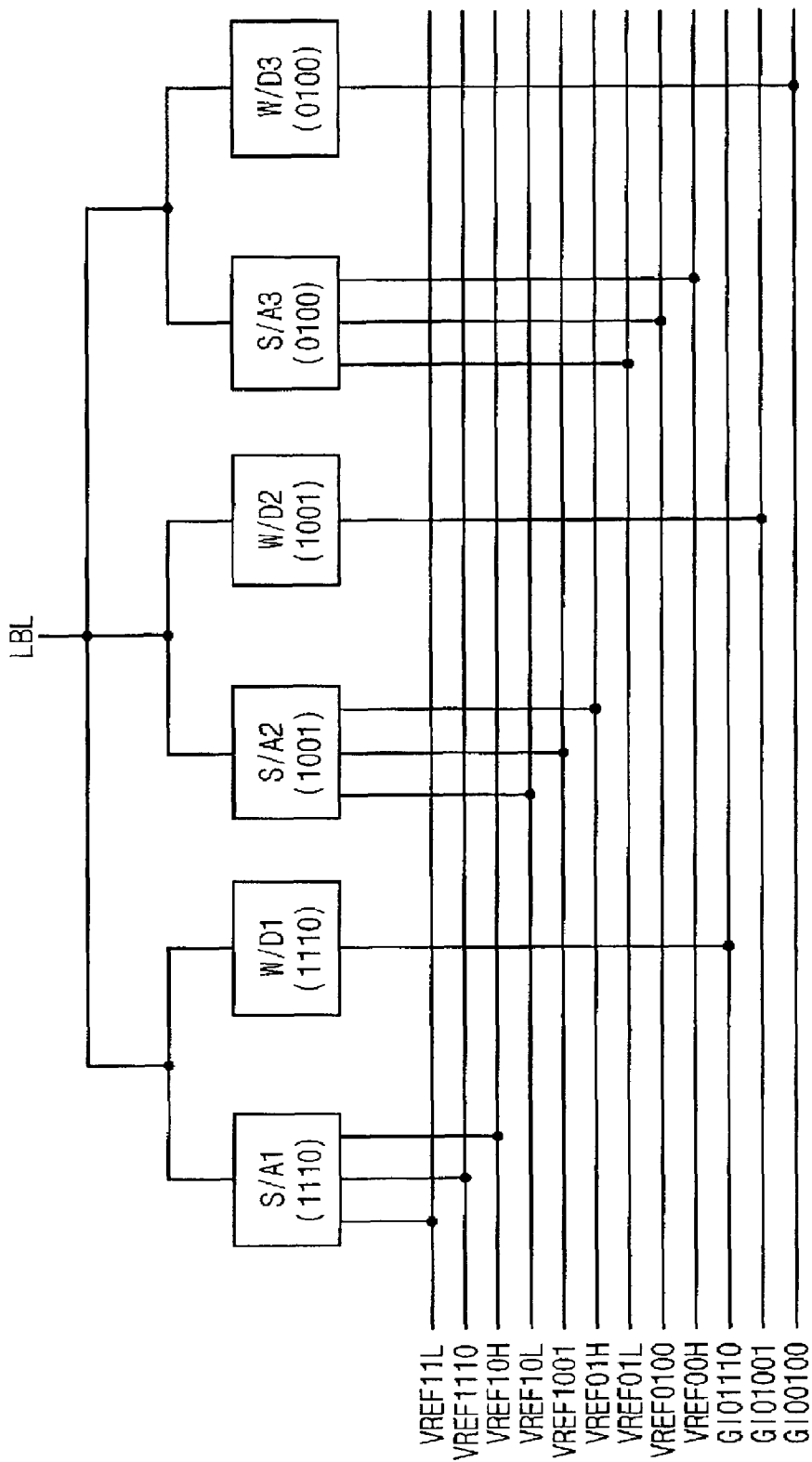
FIG. 17 is a diagram illustrating a phase change memory device according to an embodiment of the present invention.

FIG. 17 is a diagram illustrating a sense amplifier S/A and a write driving unit W/D for storing 2-bit data in a phase change memory device according to an embodiment of the present invention. For processing 2-bit data, three sense amplifiers S/A and three write driving units W/D are required.

For example, in order to sense data "1110", a reference voltage VREF1110 is applied to the sense amplifier S/A1. Reference voltages required in the write verifying operation of data "11", "10" are VREF11L, VREF10H. In order to write the data "1110" through the write driving unit W/D1, the data "1110" is applied to the global input/output line GIO.

In order to sense data "1001", a reference voltage VREF1001 is applied to the sense amplifier S/A2. In the write verifying operation of data "10", "01", reference voltages VREF10L, VREF01H are required. In order to write the data "1001" through the write driving unit W/D2, the data "1001" is applied to the global input/output line GIO.

In order to sense data "0100", a reference voltage VREF0100 is applied to the sense amplifier S/A3. In the write verifying operation of data "01", "00", reference voltages VREF01L, VREF00H are required. In order to write the data "0100" through the write driving unit W/D3, the data "0100" is applied to the global input/output line GIO.

Figure 18:
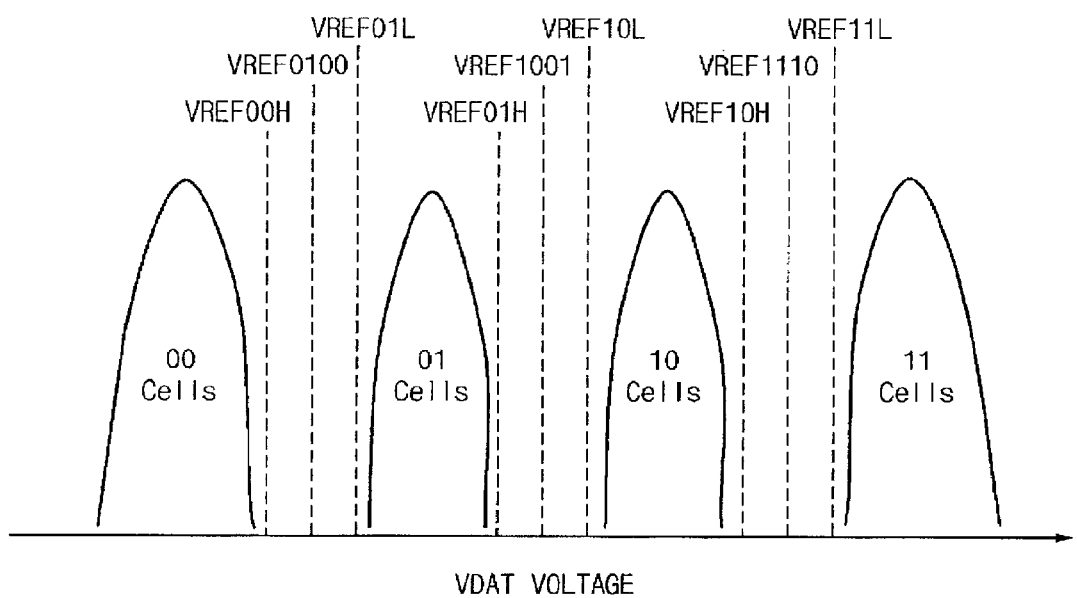
FIG. 18 is a diagram illustrating a reference voltage of a 2-bit storage cell.

FIG. 18 is a diagram illustrating a reference voltage of a 2-bit storage cell.

When 2-bit data are sensed, an output level of the cell is divided into four levels. That is, the data is divided into data "00", "01", "10", "11". Although the 2-bit data are sensed in the embodiment of the present invention, the present invention is not limited herein, but multi-level data may be sensed.

The cells having the smallest sensing voltage VDAT level are divided into "00". The cells having the largest sensing voltage VDAT level are divided into "11". Between the data "00" and "11", the data "01" having a larger sensing voltage VDAT level than that of the data "00" is divided, and the data "10" having a smaller sensing voltage VDAT level than that of the data "11".

In the sense amplifier S/A3 and the write driving unit W/D3, the levels of the data "01" and "00" are divided depending on the reference voltage VREF0100 in the read mode, and the levels of the data "01" and "00" are divided depending on the reference voltages VREF01L, VREF00H in the write verifying mode. That is, the reference voltage VREF00H is used in the write verifying mode of the data "00", and the reference voltage VREF01L is used in the write verifying mode of the data "01".

In the sense amplifier S/A2 and the write driving unit W/D2, the levels of the data "10" and "01" are divided depending on the reference voltage VREF1001 in the read mode, and the levels of the data "10" and "01" are divided depending on the reference voltages VREF10L, VREF01H in the write verifying mode. That is, the reference voltage VREF01H is used in the write verifying mode of the data "01", and the reference voltage VREF10L is used in the write verifying mode of the data "10".

In the sense amplifier S/A1 and the write driving unit W/D1, the levels of the data "11" and "10" are divided depending on the reference voltage VREF1110 in the read mode, and the levels of the data "11" and "10" are divided depending on the reference voltages VREF11L, VREF10H in the write verifying mode. That is, the reference voltage VREF10H is used in the write verifying mode of the data "10", and the reference voltage VREF11L is used in the write verifying mode of the data "11".

Figure 19:
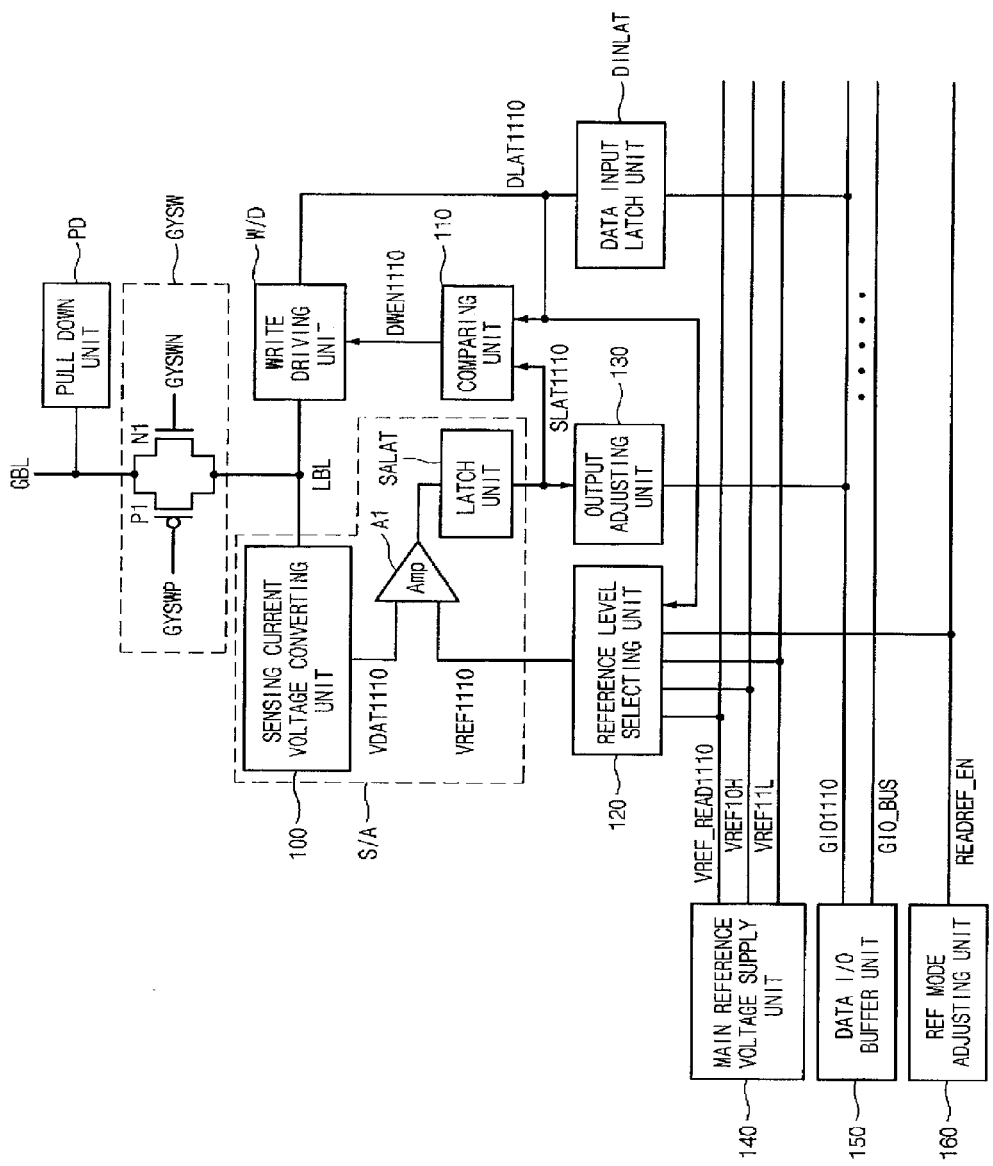
FIGS. 19 to 21 are diagrams illustrating a phase change memory device according to an embodiment of the present invention.

FIG. 19 is a diagram illustrating another example of the reference voltage supply unit of the phase change memory device according to an embodiment of the present invention. FIGS. 17 and 19 show the reference voltage supply unit for sensing and verifying the 2 bit-data "1110" in the sense amplifier S/A1 and the write driving unit W/D1.

The main reference voltage supply unit 140 outputs the reference voltage VREF_READ1110 for sensing the data "1110" in the read mode. The main reference voltage supply unit 140 outputs the reference voltages VREF10H, VREF11L for verifying the data "10", "11" in the write verifying mode.

Data GIO1110 is applied global input/output line GIO_BUS. The sensing current voltage converting unit 100 outputs a multi-level sensing voltage VDAT1110, and the reference level selecting unit 120 outputs the reference voltage VREF1110.

The comparing unit 110 compares latch data SLAT1110 with input data DLAT1110 to output a driving enable signal DWEN1110.

Figure 20:
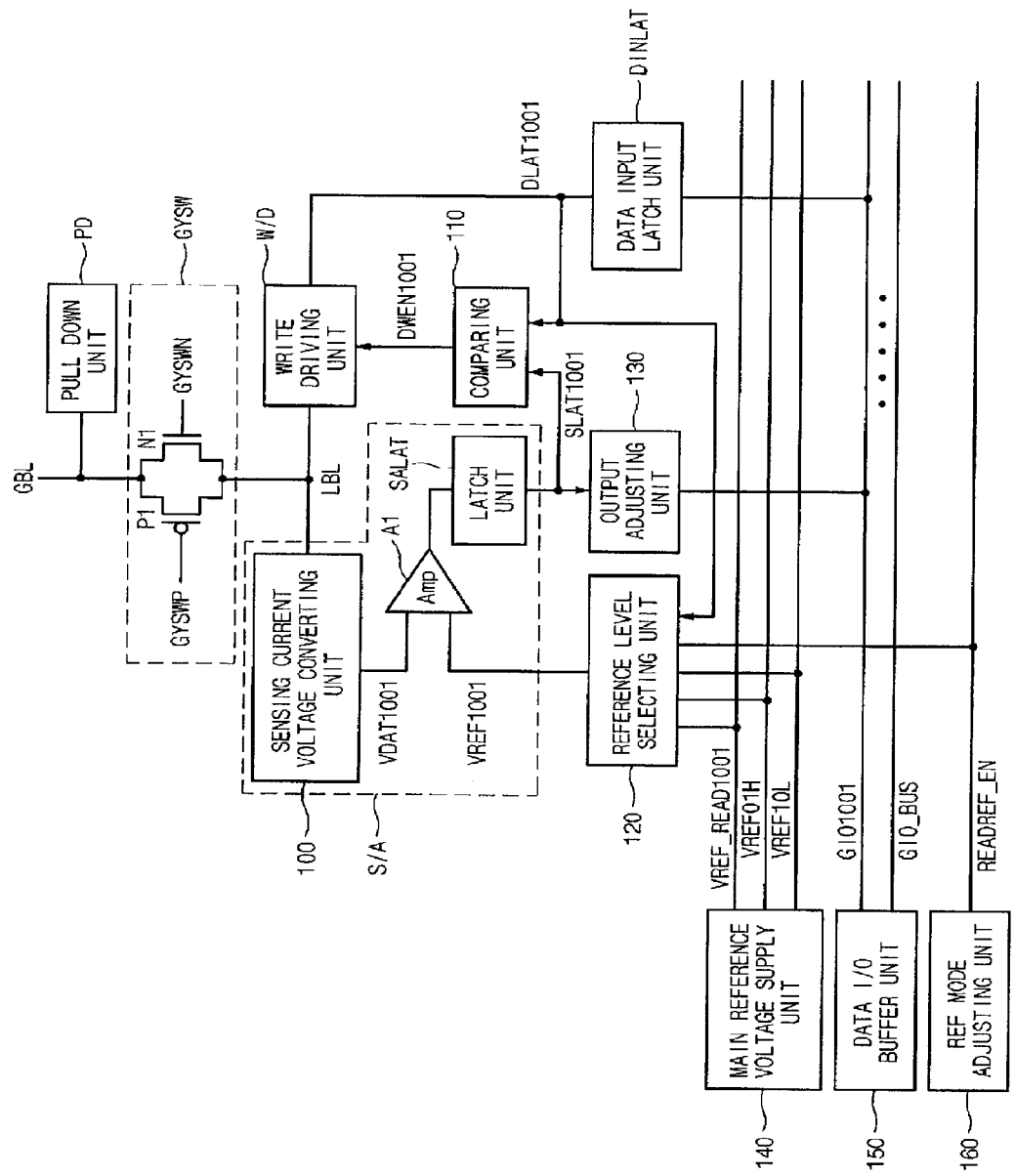

FIG. 20 is a diagram illustrating another example of the reference voltage supply unit of the phase change memory device according to an embodiment of the present invention. FIGS. 17 and 20 show the reference voltage supply unit for sensing and verifying the 2 bit-data "1001" in the sense amplifier S/A2 and the write driving unit W/D2.

The main reference voltage supply unit 140 outputs the reference voltage VREF_READ1001 for sensing the data "1001" in the read mode. The main reference voltage supply unit 140 outputs the reference voltages VREF01H, VREF10L for verifying the data "01", "10" in the write verifying mode.

Data GIO1001 is applied global input/output line GIO_BUS. The sensing current voltage converting unit 100 outputs a multi-level sensing voltage VDAT1001, and the reference level selecting unit 120 outputs the reference voltage VREF1001.

The comparing unit 110 compares latch data SLAT1001 with input data DLAT1001 to output a driving enable signal DWEN1001.

Figure 21:
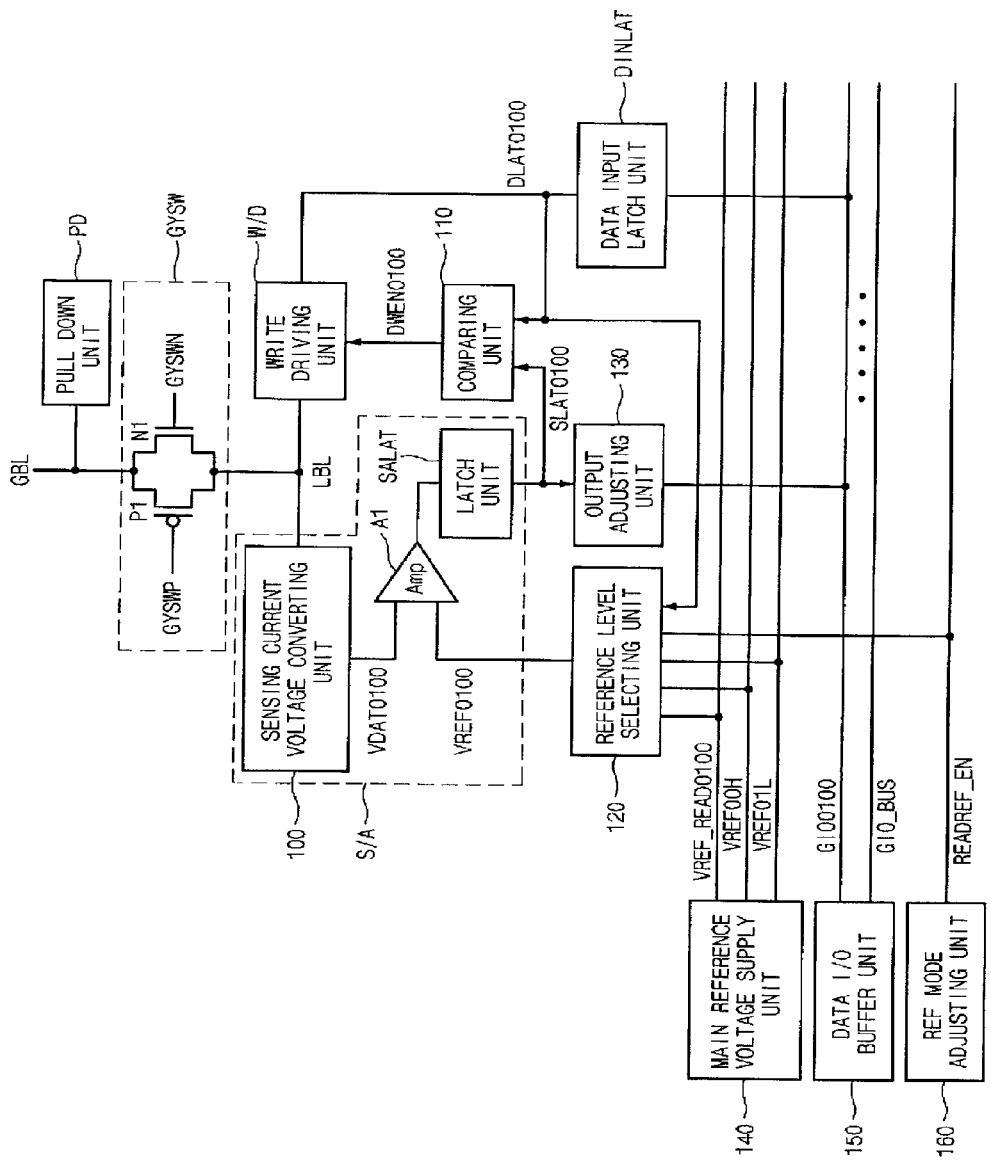

FIG. 21 is a diagram illustrating another example of the reference voltage supply unit of the phase change memory device according to an embodiment of the present invention. FIGS. 17 and 21 shows the reference voltage supply unit for sensing and verifying the 2 bit-data "0100" in the sense amplifier S/A3 and the write driving unit W/D3.

The main reference voltage supply unit 140 outputs the reference voltage VREF_READ0100 for sensing the data "0100" in the read mode. The main reference voltage supply unit 140 outputs the reference voltages VREF00H, VREF01L for verifying the data "00", "01" in the write verifying mode.

Data GIO0100 is applied global input/output line GIO_BUS. The sensing current voltage converting unit 100 outputs a multi-level sensing voltage VDAT0100, and the reference level selecting is unit 120 outputs the reference voltage VREF0100.

The comparing unit 110 compares latch data SLAT0100 with input data DLAT0100 to output a driving enable signal DWEN0100.

Figure 22:
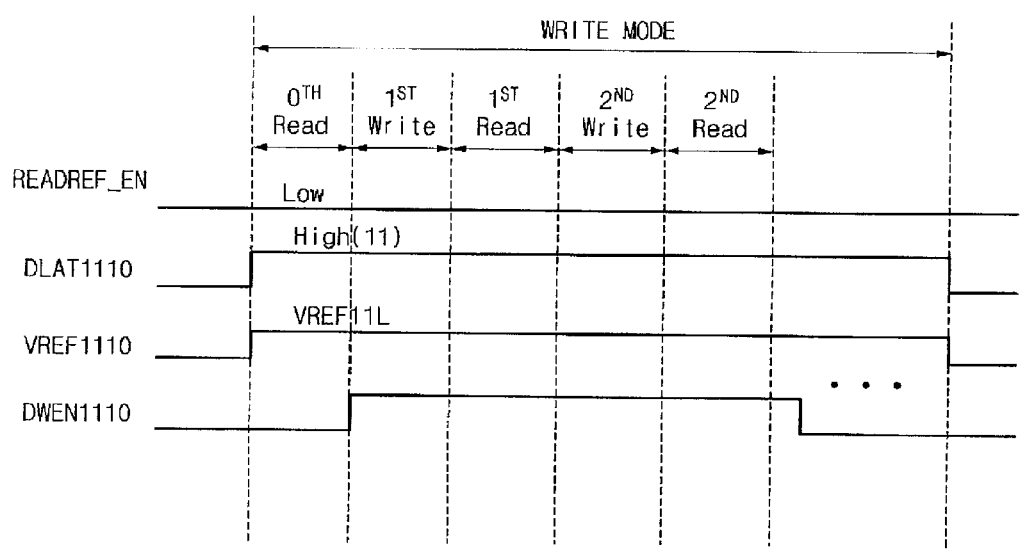
FIGS. 22 and 23 are diagrams illustrating a reference voltage level in a write verifying mode.

FIG. 22 is a diagram illustrating a reference voltage level of the write verifying mode for verifying the 2-bit data.

When the data "11" is verified in the sense amplifier S/A1 and the write driving unit W/D1, the reference enable signal READREF_EN is inactivated to a low level. When the input data DLAT1110 has a high level, that is, the data "11", the reset reference switch 123 is activated.

The reference voltage VREF1110 outputted from the reference level selecting unit 120 has a VREF11L level. The driving enable signal DWEN1110 is enabled to a high level in the first write verifying mode to activate the write driving unit W/D.

Figure 23:
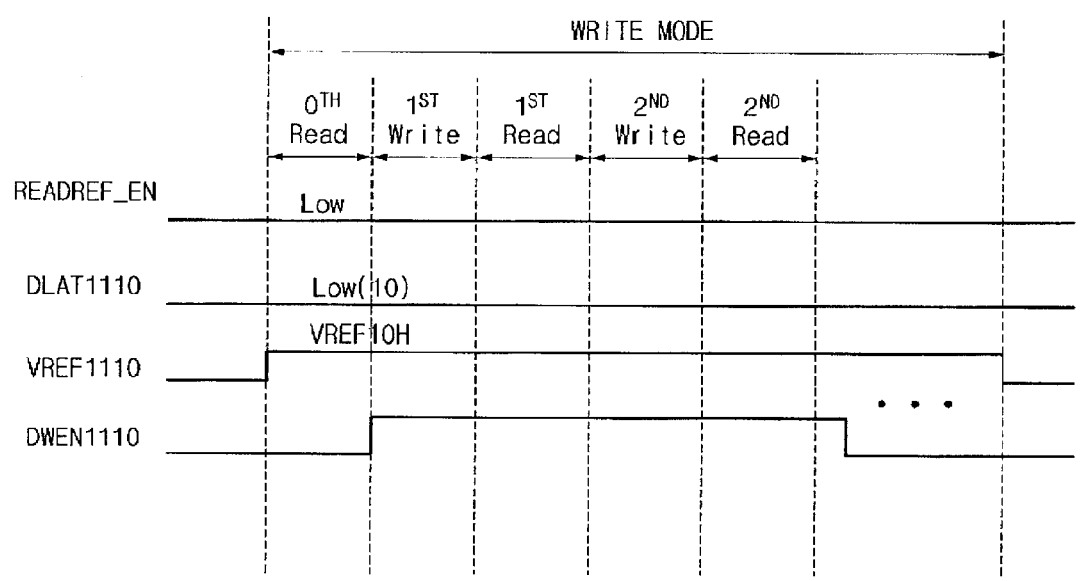

FIG. 23 is a diagram illustrating a reference voltage level of the write verifying mode for verifying the 2-bit data.

When the data "10" is verified in the sense amplifier S/A1 and the write driving unit W/D1, the reference enable signal READREF_EN is inactivated to a low level. When the input data DLAT1110 has a low level, that is, the data "10", the set reference switch 124 is activated.

The reference voltage VREF1110 outputted from the reference level selecting unit 120 has a VREF10H level. The driving enable signal DWEN1110 is enabled to a high level in the first write verifying mode to activate the write driving unit W/D.

As described above, a phase change memory device including a phase change resistor according to an embodiment of the present invention sets a different reference voltage level in a read mode and in a write verifying mode to increase stability of write data in the write verifying mode.

The phase change memory device including a phase change resistor sets a different reference voltage level in a read mode and in a write verifying mode to increase a sensing voltage margin in the read mode, thereby improving sensing performance.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:
1. A phase change memory device comprising:
a cell array including a phase change resistor configured to read/write data;
a sense amplifier configured to compare a reference voltage with a sensing voltage received from the cell array;
a write driving unit configured to supply a driving voltage corresponding to write data to the cell array wherein the sense amplifier is connected to a global bit line through a global column switching unit;
a reference level selecting unit configured to select a read reference voltage in a read mode so as to output the reference voltage, to select a set reference voltage when a input data is a set data and select a reset reference voltage when a input data is a reset data in a write verifying mode so as to output the reference voltage; and a comparing unit configured to compare the input data with output data of the sense amplifier so as to output a driving enable signal for controlling the write driving unit;

wherein the sense amplifier includes:
a sensing current voltage converting unit configured to convert a sensing current received from a bit line of the cell array into the sensing voltage;
an amplifier configured to compare and amplify the sensing voltage and the reference voltage; and
a latch unit configured to latch an output signal of the amplifier.

2. The phase change memory device according to claim 1, wherein the reference level selecting unit includes:
a read reference switch configured to output the read reference voltage with the reference voltage in response to a reference enable signal;
a set reference switching unit configured to combine the input data with the reference enable signal so as to output a set reference voltage with the reference voltage; and
a reset reference switching unit configured to combine the input data with the reference enable signal so as to output a reset reference voltage with the reference voltage.

3. The phase change memory device according to claim 2, wherein the set reference switching unit includes:
a set reference enable unit configured to output an activating signal when the reference enable signal is inactivated and the input data is the set data; and
a set reference switch configured to output a set reference voltage with the reference voltage in response to an output signal of the set reference enable unit.

4. The phase change memory device according to claim 2, wherein the reset reference switching unit includes:
a reset reference enable unit configured to output an activating signal when the reference enable signal is inactivated and the input data is the reset data; and
a reset reference switch configured to output a reset reference voltage with the reference voltage in response to an output signal of the reset reference enable unit.

5. A phase change memory device comprising:
a cell array including a phase change resistor configured to read/write data;
a plurality of sense amplifiers configured to compare multi-voltage levels of a reference voltage signal with a multi-voltage levels of a sensing voltage signal received from the cell array, wherein the sense amplifiers are connected to a global bit line through a global column switching unit;
a plurality of write driving units configured to supply multi-voltage levels of a driving voltage signal corresponding to write data to the cell array;
a reference level selecting unit configured to select a multi-voltage levels of a read reference voltage signal in a read mode so as to output the reference voltage signal, and to select one voltage level of a multi-voltage levels of a set reference voltage signal when a input data is a set data and to select one voltage level of multi-voltage levels of a reset reference voltage signal when a input data if a reset data in a write verifying mode so as to output the one voltage level of the reference voltage signal; and
a comparing unit configured to compare the input data with output data of the sense amplifiers so as to output a driving enable signal for controlling the write driving units;

wherein the sense amplifiers includes:
a sensing current voltage converting unit configured to convert a multi-level sensing current received from a bit line of the cell array into the sensing voltage signal;
an amplifier configured to compare and amplify the reference voltage signal with the sensing voltage signal; and
a latch unit configured to latch an output signal of the amplifier.

6. The phase change memory device according to claim 5, wherein the number of the sense amplifiers and the write driving units is $2^N-1$ when N-bit data is sensed (N is a natural number).

7. The phase change memory device according to claim 5, wherein each of the sense amplifiers receives a first voltage level of a read reference voltage signal in the read mode and a second voltage level of a first reference voltage signal having and a third voltage level of a second reference voltage signal in the write verifying mode.

8. The phase change memory device according to claim 5, wherein the reference level selecting unit includes:
a read reference switch configured to output the read reference voltage signal with the reference voltage signal in response to a reference enable signal;
a first reference switching unit configured to combine the input data with the reference enable signal so as to output a first reference voltage signal with the reference voltage signal; and
a second reference switching unit configured to combine the input data logically with the reference enable signal so as to output a second reference voltage signal with the reference voltage signal.

9. The phase change memory device according to claim 1, further comprising:
a main reference voltage supply unit configured to generate the read reference voltage, the set reference voltage and the reset reference voltage having a different level from the read reference voltage; and
a reference mode adjusting unit configured to select the read reference voltage, the set reference voltage or the reset reference voltage in a read mode so as to generate a reference enable signal.

10. The phase change memory device according to claim 5, further comprising:
a main reference voltage supply unit configured to generate the read reference voltage signal, the set reference voltage signal and the reset reference voltage signal having a different level from those of the read reference voltage signal; and
a reference mode adjusting unit configured to generate a reference enable signal for selecting the read reference voltage signal, the set reference voltage signal or the reset reference voltage signal in the read mode.

11. The phase change memory device according to claim 1, further comprising:
a pull-down unit configured to pull down the global bit line in a precharge mode.

12. The phase change memory device according to claim 5, further comprising:
a pull-down unit configured to pull down the global bit line in a precharge mode.

13. The phase change memory device according to claim 1, further comprising:
an output adjusting unit configured to control an output signal of the sense amplifier so as to output the output signal to a global input/output line; and
a data input latch unit configured to latch data of the global input/output line so as to output the input data.

14. The phase change memory device according to claim 13, further comprising a data input/output buffer unit configured to buffer input/output data of the global input/output line.

15. The phase change memory device according to claim 13, wherein the comparing unit activates the driving enable signal when a level of output data of the sense amplifier is different from that of the input data.

16. The phase change memory device according to claim 5, further comprising:
   an output adjusting unit configured to control an output signal of the sense amplifier so as to output the output signal to a global input/output line; and
   a data input latch unit configured to latch data of the global input/output line so as to output the input data.

17. The phase change memory device according to claim 16, further comprising a data input/output buffer unit configured to buffer input/output data of the global input/output line.

18. The phase change memory device according to claim 16, wherein the comparing unit activates the driving enable signal when a level of output data of the sense amplifier is different from that of the input data.

19. The phase change memory device according to claim 1, wherein the sensing current voltage converting unit includes:
   a precharge unit configured to precharge the sensing voltage to have a high voltage in response to a first precharge signal;
   a sensing current adjusting unit configured to adjust a level of the sensing voltage in response to an adjusting signal;
   a clamp voltage adjusting unit configured to adjust a clamp voltage of a global bit line in response to a clamp signal; and
   a clamp voltage precharge unit configured to precharge the global bit line in response to the clamp signal.

20. The phase change memory device according to claim 5, wherein the sensing current voltage converting unit includes:
   a precharge unit configured to precharge the sensing voltage signal to a high level in response to a first precharge signal;
   a sensing current adjusting unit configured to adjust a voltage level of the sensing voltage signal in response to an adjusting signal;
   a clamp voltage adjusting unit configured to adjust a clamp voltage signal of a global bit line in response to a clamp signal; and
   a clamp voltage precharge unit configured to precharge the global bit line in response to the clamp signal.

* * * * *